United States Patent
Takeuchi et al.

(10) Patent No.: US 9,217,106 B2
(45) Date of Patent: Dec. 22, 2015

(54) ETCHANT AND ETCHING PROCESS FOR OXIDES CONTAINING AT LEAST INDIUM AND GALLIUM

(71) Applicant: Mitsubishi Gas Chemical Company, Inc., Chiyoda-ku (JP)

(72) Inventors: Hidenori Takeuchi, Tokyo (JP); Kunio Yube, Tokyo (JP); Satoshi Okabe, Tokyo (JP); Mari Usui, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 58 days.

(21) Appl. No.: 14/083,940

(22) Filed: Nov. 19, 2013

(65) Prior Publication Data
US 2014/0186996 A1 Jul. 3, 2014

(30) Foreign Application Priority Data

Dec. 28, 2012 (JP) ................. 2012-287277

(51) Int. Cl.
*H01L 29/10* (2006.01)
*H01L 29/12* (2006.01)
*C09K 13/06* (2006.01)
*H01L 21/465* (2006.01)

(52) U.S. Cl.
CPC ............. *C09K 13/06* (2013.01); *H01L 21/465* (2013.01)

(58) Field of Classification Search
CPC ............ H01L 27/1225; H01L 29/7869; H01L 21/465; H01L 21/3213; H01L 21/32133; H01L 21/67075
USPC ........... 257/40, 43, 59, 72; 438/149, 104, 128
See application file for complete search history.

(56) References Cited

U.S. PATENT DOCUMENTS

| | | | |
|---|---|---|---|
| 2005/0266165 A1* | 12/2005 | Mobius et al. | 427/304 |
| 2006/0043332 A1 | 3/2006 | Cho et al. | |
| 2009/0149030 A1 | 6/2009 | Chang | |
| 2010/0283050 A1* | 11/2010 | Lee et al. | 257/43 |
| 2011/0049088 A1* | 3/2011 | Matsubara et al. | 216/13 |
| 2014/0097006 A1* | 4/2014 | Park et al. | 174/257 |
| 2014/0162403 A1* | 6/2014 | Okabe et al. | 438/104 |
| 2014/0193945 A1* | 7/2014 | Li et al. | 438/104 |

FOREIGN PATENT DOCUMENTS

| | | |
|---|---|---|
| JP | 2000-8184 | 1/2000 |
| JP | 2006-77241 | 3/2006 |
| JP | 2007-317856 | 12/2007 |
| JP | 2008-41695 | 2/2008 |
| JP | 2009-218513 | 9/2009 |
| JP | 2010-45253 | 2/2010 |
| WO | WO 2008/032728 A1 | 3/2008 |

\* cited by examiner

Primary Examiner — Thanh Y Tran

(74) Attorney, Agent, or Firm — Oblon, McClelland, Maier & Neustadt, L.L.P.

(57) ABSTRACT

The present invention relates to an etchant and an etching process, which are preferred for use in etching of oxides containing at least indium and gallium, such as an oxide consisting of indium, gallium and oxygen or an oxide consisting of indium, gallium, zinc and oxygen. According to preferred embodiments of the present invention, an etchant comprising sulfuric acid or a salt thereof and a carboxylic acid (except for oxalic acid) or a salt thereof ensures a preferred etching rate, a good residue removal property and low corrosiveness to wiring materials when used in etching of oxides containing at least indium and gallium. Moreover, this etchant not only causes no precipitate but also retains a preferred etching rate even when the concentration of oxides dissolved in the etchant is elevated.

16 Claims, No Drawings

ETCHANT AND ETCHING PROCESS FOR OXIDES CONTAINING AT LEAST INDIUM AND GALLIUM

TECHNICAL FIELD

The present invention relates to an etchant for etching an oxide containing at least indium and gallium for use in display devices such as liquid crystal displays (LCDs) and electroluminescent displays (LEDs), and an etching process using the same.

BACKGROUND ART

As a semiconductor layer in display devices such as liquid crystal displays or electroluminescent displays, amorphous silicon or low temperature polysilicon has been used widely. However, various oxide semiconductor materials are now developed against the backdrop of the need for displays to have a larger screen, a higher definition, a lower power consumption, etc.

Oxide semiconductor materials are composed mainly of indium, gallium, zinc and tin, and oxides of various composition are now studied, as exemplified by indium gallium zinc oxide (IGZO), indium gallium oxide (IGO), indium tin zinc oxide (ITZO), indium gallium zinc tin oxide (IGZTO), indium gallium zinc silicon oxide (IGZSO), gallium zinc oxide (GZO), zinc tin oxide (ZTO) and so on. Among them, oxides containing indium and gallium (e.g., IGZO and IGO) are particularly well studied.

An oxide containing at least indium and gallium, such as an oxide consisting of indium, gallium and oxygen or an oxide consisting of indium, gallium, zinc and oxygen, is formed on a substrate (e.g., glass) by means of film formation processes such as sputtering techniques. Subsequently, a resist or the like is used as a mask and the oxide formed on the substrate is etched to form an electrode pattern. This etching process includes wet and dry processes, and an etchant is used in wet processes.

Oxides containing at least indium and gallium, such as an oxide consisting of indium, gallium and oxygen, as well as an oxide consisting of indium, gallium, zinc and oxygen, are generally known to be soluble in acids. In the case of using these oxides to form semiconductor layers in display devices such as liquid crystal displays, an etchant is required to have the following performance characteristics.
(1) Upon oxide dissolution in the etchant, no precipitate occurs.
(2) Upon oxide dissolution in the etchant, a reduction in the etching rate is small.
(3) The etchant has a preferred etching rate.
(4) The etchant gives few etching residues.
(5) The etchant causes no corrosion in elements such as wiring materials.

With the progress of etching of oxides, the oxide concentration in the etchant is increased, but the etchant remains stable because its etching rate is only slightly affected upon oxide dissolution. This property means that the amount of etched oxides per fixed volume of etchant can be increased, and it is very important in industrial production to conduct etching of semiconductor layers.

Moreover, the etching rate is desirably 10 to 1000 nm/min, more preferably 20 to 200 nm/min, and even more preferably 50 to 100 nm/min. At an etching rate of 10 to 1000 nm/min, the production efficiency can be maintained and etching operations can be conducted stably.

In cases where etching residues having conductivity are left after etching, these residues are not favorable because they may cause leakage current between electrodes. Alternatively, in cases where etching residues having no conductivity are present, these residues may be responsible for poor wiring, void formation, poor adhesion and so on in the subsequent steps.

Wiring materials include copper (Cu), aluminum (Al), molybdenum (Mo) and titanium (Ti), and there may be a possibility that an etchant will contact with these wiring materials during oxide etching. Thus, a preferred etchant is less corrosive to wiring materials. More specifically, the etching rate to the wiring materials is desirably 3 nm/min or less, more preferably 2 nm/min or less, and particularly preferably 1 nm/min or less.

When an etchant containing oxalic acid is used for etching of transparent conductive films composed of indium oxide as a major component, there arises a problem that a salt formed between oxalic acid and indium will be precipitated as a solid matter with the progress of etching. The appearance of this precipitate would be due to the presence of excess indium which forms a salt with oxalic acid and appears as a precipitate because the soluble concentration of indium is around 200 ppm in commonly used etchants containing oxalic acid. The precipitation of such a solid matter is fatal in the production processes of electronic components where even particles smaller than 1 μm will cause a problem. Moreover, this precipitate will clog filters which are provided for etchant circulation, and high costs may be required for their replacement. For this reason, even when an etchant still has sufficient performance, the etchant should be replaced with fresh one before precipitation of this salt, as a result of which the etchant is made to have a shorter period for use.

Patent Document 1 (WO2008/32728) describes that when a composition containing (a) oxalic acid, (b) a naphthalenesulfonic acid condensate or a salt thereof, (c) at least one of hydrochloric acid, sulfuric acid, a water-soluble amine and salts thereof, and (d) water is used for etching of indium tin oxide films (ITO films), no residue occurs and it is further possible to prevent precipitation of a salt between oxalic acid and indium.

Patent Document 2 (JP 2010-45253 A) describes that when using an etchant for transparent conductive films, which comprises oxalic acid and an alkaline compound (except for triethanolamine), it is possible to effectively prevent precipitation of indium oxalate crystals even at a high indium concentration in the etchant during the etching processes of transparent conductive films such as ITO films or IZO films.

Patent Document 3 (JP 2009-218513 A) discloses an oxalic acid-free etchant, which comprises, e.g., sulfuric acid and an anionic surfactant having a hydrocarbon group containing 12 or more carbon atoms as major components. This etchant is regarded as having a longer life as an etchant because of exerting a good ability for residue removal and a high ability for indium dissolution to thereby prevent solid matter precipitation when used for etching of amorphous indium oxide (ITO)-based films.

Patent Document 4 (JP 2006-77241 A) discloses an etchant for indium oxide-based transparent conductive films such as ITO films or IZO films, which comprises sulfuric acid as a main oxidizer and phosphoric acid, nitric acid, acetic acid or the like as an auxiliary oxidizer.

Patent Document 5 (JP 2000-8184 A) discloses an etching process using an etchant containing sulfuric acid, nitric acid and a buffer (e.g., acetate, phosphate, oxalate, formate and citrate buffers) for etching of a multi-layer conductive film constituted by laminating a silver-based thin film and a transparent oxide thin film composed of indium oxide as a major component.

Patent Document 6 (JP 2008-41695 A) discloses an oxide etching process, which is characterized by involving a step where an amorphous oxide layer comprising indium and at least one selected from gallium or zinc is etched with an etchant comprising any one of acetic acid, citric acid, hydrochloric acid or perchloric acid.

Patent Document 7 (JP 2007-317856 A) describes that when an etchant composed of an aqueous solution comprising one or more compounds selected from the group consisting of organic acids (e.g., citric acid, aconitic acid) and ammonium salts thereof is used for etching of transparent conductive films comprising zinc oxide as a major component, no residue occurs, an adequate etching rate is achieved and the etching performance is stable against zinc dissolution.

PRIOR ART DOCUMENTS

Patent Documents

Patent Document 1: WO2008/32728
Patent Document 2: JP 2010-45253 A
Patent Document 3: JP 2009-218513 A
Patent Document 4: JP 2006-77241 A
Patent Document 5: JP 2000-8184 A
Patent Document 6: JP 2008-41695 A
Patent Document 7: JP 2007-317856 A

SUMMARY OF THE INVENTION

Problem to be Solved by the Invention

In each of the etchants disclosed in Patent Documents 1 and 2, precipitates will also occur at a higher indium concentration, which may cause a reduction in the etching rate. Moreover, in cases where transparent conductive films contain zinc, zinc oxalate may be precipitated upon dissolution of the transparent conductive films.

Patent Document 3 does not disclose any information about the etching rate when indium is dissolved in the etchant. In the etchant of this composition, there is a concern about a reduction in the etching rate.

Patent Document 4 does not provide any information about the ability of the etchant to dissolve indium oxide or the like and about the etching performance when indium is dissolved in the etchant, and it also makes no mention of the life of the etchant.

In Patent Document 5, a buffer is mixed into the etchant for the purpose of preventing volatilization of nitric acid. Patent Document 5 does not provide any information about the ability of the etchant to dissolve indium oxide or the like and about the etching performance when indium is dissolved in the etchant, nor does it clearly show the life of the etchant.

In addition, Patent Documents 1 to 5 are each directed to an etchant for use in indium oxide-based transparent conductive films such as ITO films or IZO films, and hence they do not address at all the etching performance on oxides containing indium and gallium, e.g., IGO films or IGZO films.

Patent Document 6 is directed to an etching process for a structure comprising an ITO layer and an oxide layer (e.g., IZO or IGZO). However, acetic acid or citric acid alone cannot achieve a practically sufficient etching rate. Moreover, Patent Document 6 does not provide any information about the ability of the etchant to dissolve oxides and about the etching rate when indium or the like is dissolved in the etchant, and it also makes no mention of the life of the etchant.

Patent Document 7 describes that the intended etchant can be used for transparent conductive films comprising zinc oxide as a major component, although it is only gallium zinc oxide (GZO) that is actually studied in the Example section. If transparent conductive films comprising zinc oxide as a major component further contain indium, this etchant cannot achieve a practically sufficient etching rate.

Under these circumstances, there is a demand for the provision of an etchant for use in etching of oxides containing indium and gallium, which has a preferred etching rate, causes no precipitate, is less corrosive to wiring materials, ensures a small change in the etching rate upon oxide dissolution, and further has a longer life as an etchant.

Means to Solve the Problem

The present invention relates to an etchant for etching an oxide containing at least indium and gallium, such as an oxide consisting of indium, gallium and oxygen or an oxide consisting of indium, gallium, zinc and oxygen, wherein the etchant comprises sulfuric acid or a salt thereof and a carboxylic acid (except for oxalic acid) or a salt thereof. The summary of the present invention is as follows.

1. An etchant for etching an oxide containing at least indium and gallium, which comprises sulfuric acid or a salt thereof and a carboxylic acid (except for oxalic acid) or a salt thereof
2. The etchant according to 1 above, wherein the carboxylic acid (except for oxalic acid) or a salt thereof is one or more members selected from the group consisting of acetic acid, glycolic acid, lactic acid, malonic acid, maleic acid, succinic acid, malic acid, tartaric acid and citric acid.
3. The etchant according to 1 above, wherein the sulfuric acid or a salt thereof is in a concentration of 0.5% to 20% by mass, and the carboxylic acid or a salt thereof is in a concentration of 0.1% to 15% by mass.
4. The etchant according to any one of 1 to 3 above, which further comprises a pH adjuster.
5. The etchant according to 4 above, wherein the pH adjuster is one or more members selected from the group consisting of methanesulfonic acid and amidosulfuric acid.
6. The etchant according to any one of 1 to 5 above, which has a pH value equal to or less than 1.
7. The etchant according to any one of 1 to 6 above, which further comprises a polysulfonic acid compound.
8. The etchant according to 7 above, wherein the polysulfonic acid compound is one or more members selected from the group consisting of a naphthalenesulfonic acid formalin condensate and a salt thereof, a polyoxyethylene alkyl ether sulfate salt, and a polyoxyethylene alkylphenyl ether sulfate salt.
9. The etchant according to any one of 1 to 8 above, wherein the oxide is in the form of a thin film having a film thickness of 1 to 1000 nm (10 to 10000 Å).
10. A process for etching an oxide containing at least indium and gallium, which comprises using the etchant according to any one of 1 to 8 above.
11. The process according to 10 above, wherein the oxide is in the form of a thin film having a film thickness of 1 to 1000 nm (10 to 10000 Å).

Effects of the Invention

According to preferred embodiments of the present invention, the etchant of the present invention has a preferred etching rate, causes no precipitate, has a good residue removal property, is less corrosive to wiring materials, and further ensures a small change in the etching rate upon oxide dissolution, so that preferred etching operations can be conducted stably for a long period of time.

DESCRIPTION OF EMBODIMENTS

Oxides containing at least indium and gallium which can be etched with the etchant of the present invention are not limited in any way, as long as they are oxides containing indium and gallium. Such oxides may further comprise one or more elements in addition to indium and gallium. Preferred examples include an oxide consisting of indium, gallium, zinc and oxygen (IGZO), an oxide consisting of indium, gallium and oxygen (IGO), an oxide consisting of indium, gallium, zinc, silicon and oxygen (IGZSO), etc. Typical oxides used in semiconductor materials for display devices such as displays are indium gallium zinc oxide (IGZO) and indium gallium oxide (IGO). Among them, IGZO is particularly preferred. In addition, such an oxide more preferably has an amorphous structure.

The etchant of the present invention comprises sulfuric acid or a salt thereof and a carboxylic acid (except for oxalic acid) or a salt thereof.

Sulfuric acid or a salt thereof to be contained in the etchant of the present invention is not limited in any way, as long as it has the ability to supply sulfate ions. Preferred examples include sulfuric acid, fuming sulfuric acid, ammonium sulfate, sodium sulfate, potassium sulfate, ammonium bisulfate, sodium bisulfate, potassium bisulfate and so on, with sulfuric acid being more preferred. Moreover, the concentration of sulfuric acid or a salt thereof is preferably 0.5% by mass or more, more preferably 1% by mass or more, and even more preferably 3% by mass or more, when calculated as sulfuric acid (molecular weight of $H_2SO_4$: 98.08). On the other hand, the concentration is preferably 20% by mass or less, more preferably 15% by mass or less, and even more preferably 9% by mass or less. Above all, the concentration is preferably 0.5% to 20% by mass, more preferably 1% to 15% by mass, and even more preferably 3% to 9% by mass. At a concentration of 0.5% to 20% by mass, a good etching rate is achieved.

A carboxylic acid (except for oxalic acid) or a salt thereof to be contained in the etchant of the present invention is not limited in any way, as long as it has the ability to supply carboxylate ions (except for oxalate ions). Preferred examples include aliphatic carboxylic acids containing 1 to 18 carbon atoms, aromatic carboxylic acids containing 6 to 10 carbon atoms, as well as amino acids containing 1 to 10 carbon atoms, etc.

Preferred examples of aliphatic carboxylic acids containing 1 to 18 carbon atoms or salts thereof include formic acid, acetic acid, propionic acid, lactic acid, glycolic acid, diglycolic acid, pyruvic acid, malonic acid, butyric acid, hydroxybutyric acid, tartaric acid, succinic acid, malic acid, maleic acid, fumaric acid, valeric acid, glutaric acid, itaconic acid, adipic acid, caproic acid, adipic acid, citric acid, propanetricarboxylic acid, trans-aconitic acid, enanthic acid, caprylic acid, lauric acid, myristic acid, palmitic acid, stearic acid, oleic acid, linolic acid, linolenic acid or salts thereof, etc.

Preferred examples of aromatic carboxylic acids containing 6 to 10 carbon atoms and salts thereof include benzoic acid, salicylic acid, mandelic acid, phthalic acid, isophthalic acid, terephthalic acid or salts thereof, etc.

Preferred examples of amino acids containing 1 to 10 carbon atoms include carbamic acid, alanine, glycine, asparagine, aspartic acid, sarcosine, serine, glutamine, glutamic acid, 4-aminobutyric acid, iminodibutyric acid, arginine, leucine, isoleucine, nitrilotriacetic acid or salts thereof.

More preferred carboxylic acids or salts thereof are acetic acid, glycolic acid, lactic acid, malonic acid, maleic acid, succinic acid, malic acid, tartaric acid, citric acid or salts thereof, with acetic acid, malic acid and citric acid being particularly preferred. These may be used either alone or in combination.

The concentration of a carboxylic acid (except for oxalic acid) or a salt thereof is preferably 0.1% by mass or more, more preferably 1% by mass or more, and even more preferably 3% by mass or more, when calculated as a carboxylic acid. On the other hand, the concentration is preferably 15% by mass or less, more preferably 12% by mass or less, and even more preferably 10% by mass or less. Above all, the concentration is preferably 0.1% to 15% by mass, more preferably 1% to 12% by mass, even more preferably 1.0% to 12.0% by mass, still more preferably 3% to 10% by mass, and still even more preferably 3.0% to 10.0% by mass. At a concentration of 0.1% to 15% by mass, it is possible to minimize a reduction in the etching rate upon oxide dissolution.

The etchant of the present invention may optionally contain a pH adjuster for the purpose of pH adjustment. The pH adjuster may be of any type as long as it does not affect the etching performance. Although sulfuric acid or a salt thereof, a carboxylic acid (except for oxalic acid) or a salt thereof may also be used for pH adjustment, methanesulfonic acid, amidosulfuric acid and so on may further be used for this purpose.

The etchant of the present invention has a pH value of preferably 1 or less, more preferably 0.7 or less, and even more preferably 0 to 0.5. In a pH range higher than 1, a practically sufficient etching rate may not be achieved.

The etchant of the present invention may optionally contain a polysulfonic acid compound. Preferred examples of a polysulfonic acid compound include a naphthalenesulfonic acid formalin condensate and a salt thereof, a polyoxyethylene alkyl ether sulfate salt, and a polyoxyethylene alkylphenyl ether sulfate salt, etc. Such a naphthalenesulfonic acid formalin condensate is commercially available under the trade name DEMOL N (Kao Corporation, Japan), LAVELIN FP (Dai-ichi Kogyo Seiyaku Co., Ltd., Japan), POLITY N-100K (Lion Corporation, Japan) or the like.

The concentration of a polysulfonic acid compound is preferably within a range of 0.0001% to 10% by mass. At a concentration within this range, the etchant shows a good residue removal effect. The concentration of a polysulfonic acid compound is more preferably 0.001% by mass or more, and even more preferably 0.01% by mass or more. On the other hand, the concentration is preferably 3% by mass or less, and more preferably 1% by mass or less.

In addition to the ingredients mentioned above, the etchant of the present invention may further comprise various additives commonly used in etchants within a range that does not impair the effects of the etchant. For example, it is possible to use a solvent or a pH buffering agent, etc.

Preferred as a solvent is water which has been treated to remove metal ions, organic impurities and particles by distillation, ion exchange, filtration, various adsorption techniques or the like. Particularly preferred is pure water or ultrapure water.

In the etching process of the present invention, an oxide containing at least indium and gallium is used as an etching target. The etching process of the present invention involves the step of contacting an etching target with the etchant of the present invention, i.e., an etchant comprising sulfuric acid or a salt thereof and a carboxylic acid (except for oxalic acid) or a salt thereof. The etching process of the present invention allows prevention of residue or precipitate formation even when etching operations are repeated continuously. Moreover, due to a small change in the etching rate, etching operations can be conducted stably for a long period of time.

An etching target which can be etched by the etching process of the present invention is of any shape, but it is preferably in the form of a thin film when used as a semiconductor material for flat panel displays. For example, a thin film of an oxide consisting of indium, gallium, zinc and oxygen is formed on an insulating film (e.g., made of silicon oxide), onto which a resist is then applied and exposed to transfer a desired pattern mask, followed by development to form a desired resist pattern for use as an etching target. In cases where the etching target is in the form of a thin film, its film thickness is preferably within a range of 1 to 1000 nm (10 to 10000 Å), more preferably 5 to 500 nm (50 to 5000 Å), and particularly preferably 10 to 300 nm (100 to 3000 Å). Alternatively, the etching target may be a laminated structure composed of two or more oxide thin films of different composition. In this case, such a laminated structure composed of two or more oxide thin films of different composition can be etched collectively.

The contact temperature between the etching target and the etchant (i.e., the temperature of the etchant at the time of contacting with the etching target) is preferably 10° C. or more, more preferably 15° C. or more, and even more preferably 20° C. or more. On the other hand, the contact temperature is preferably 70° C. or less, more preferably 60° C. or less, and even more preferably 50° C. or less. Particularly preferred is a temperature of 10° C. to 70° C., more preferably 15° C. to 60° C., and especially preferably 20° C. to 50° C. At a temperature range of 10° C. to 70°, a good etching rate is achieved. Further, when etching operations are conducted at the above temperature range, corrosion of apparatuses can be prevented. As the temperature of the etchant is raised, the etching rate will be increased, but water evaporation or other factors will cause a larger change in the composition of the etchant. In consideration of these factors, the optimal treatment temperature may be determined as appropriate.

Any technique may be used to contact the etching target with the etchant, and it is possible to use conventional wet etching processes, such as those where the etchant may be dropped (sheet-fed spin treatment) or sprayed to come in contact with the target or where the target may be immersed in the etchant.

EXAMPLES

Embodiments and effects of the present invention will be further described in more detail by way of the following examples and comparative examples, although the present invention is not limited to these examples.

1. Measurement of Etching Rate

On a glass substrate, an IGZO film containing indium (In), gallium (Ga), zinc (Zn) and oxygen (O) at an elemental ratio of 1:1:1:4 was formed to have a film thickness of 50 nm (500 Å) by sputtering techniques, followed by etching with the etchants shown in Tables 1 and 2. Etching was accomplished by immersing the above substrate under stationary conditions in each etchant maintained at 35° C. The film thickness before and after the etching was measured with an n&k Analyzer 1280 for optical thin-film characterization (n&k Technology Inc.), and the difference between the measured film thicknesses was divided by the etching time to calculate an etching rate. The evaluation results were expressed according to the following criteria.

A: etching rate is 50 nm/min to 100 nm/min
B: etching rate is 20 to 49 nm/min or is 101 to 200 nm/min
C: etching rate is 10 to 19 nm/min or is 201 to 1000 nm/min
D: etching rate is 9 nm/min or less or is 1001 nm/min or more It should be noted that A, B and C are regarded as successful in this evaluation.

2. Confirmation of Precipitates Upon Oxide Dissolution

In the etchants shown in Tables 1 and 2, an IGZO powder (In:Ga:Zn:O=1:1:1:4; Toshima Manufacturing Co., Ltd., Japan) was dissolved at a concentration of 0.5% (5000 ppm), and the resulting solutions were visually confirmed for the presence or absence of precipitates. The evaluation results were expressed according to the following criteria. A is regarded as successful in this evaluation.

A: no precipitate occurs
B: precipitates occur

3. Measurement of a Change in Etching Rate after Oxide Dissolution

On a glass substrate, an IGZO film containing indium, gallium, zinc and oxygen at an elemental ratio of 1:1:1:4 was formed to have a film thickness of 50 nm (500 Å) by sputtering techniques. Using solutions prepared by dissolving a given amount of an IGZO powder in the etchants shown in Tables 1 and 2, the etching rate was measured in the same manner as described above to calculate a change in the etching rate for each etchant. The evaluation results were expressed according to the following criteria.

A: change in the etching rate is 5 nm/min or less
B: change in the etching rate is greater than 5 nm/min to 10 nm/min or less
C: change in the etching rate is greater than 10 nm/min It should be noted that A and B are regarded as successful in this evaluation.

4. Evaluation of Residue Removal Property

On a glass substrate, an IGZO film containing indium, gallium, zinc and oxygen at an elemental ratio of 1:1:1:4 was formed to have a film thickness of 50 nm (500 Å) by sputtering techniques and a resist pattern was further formed thereon by photolithography. The substrates thus prepared were etched with the etchants shown in Tables 1 and 2. Etching was accomplished by showering at 35° C. The etching time was set to be 2.0 times longer (100% overetching condition) than the time required for etching (just etching time). It should be noted that the just etching time was calculated by diving the film thickness of the IGZO film by the etching rate measured in "1. Measurement of etching rate" above (in the case of Example 1 described later, the just etching time is determined as follows: IGZO film thickness 50 [nm]/etching rate 81 [nm/min]=0.617 [min]=37 seconds, and hence the treatment time under 100% overetching condition is calculated as follows: 37 seconds×2.0=74 seconds). The etched substrates were each washed with water, dried by blowing a nitrogen gas, and then observed for residues under a scanning electron microscope ("S5000H (model number)"; Hitachi, Ltd., Japan). The results were expressed according to the following criteria.

A: no residue occurs
B: a few residues occur
C: many residues occur

It should be noted that A and B are regarded as successful in this evaluation.

5. Measurement of Etching Rate in Wiring Materials (Corrosiveness)

A Cu/Ti laminate film, an Al/Ti laminate film, a Mo single-layer film and a Ti single-layer film, each of which had been formed on a glass substrate by sputtering techniques, were used to measure the etching rates of Cu, Al, Mo and Ti with the etchants shown in Tables 1 and 2. Etching was accomplished by immersing the above substrates in each etchant maintained at 35° C. The film thickness before and after the etching was measured with an X-ray fluorescence analyzer SEA1200VX (Seiko Instruments Inc., Japan), and the difference between the measured film thicknesses was divided by the etching time to calculate an etching rate. The evaluation results were expressed according to the following criteria.

A: etching rate is less than 1 nm/min
B: etching rate is 1 nm/min to less than 2 nm/min
C: etching rate is 2 nm/min to less than 3 nm/min
D: etching rate is 3 nm/min or more It should be noted that A, B and C are regarded as successful in this evaluation.

Example 1

A 100 ml polypropylene container was charged with 10.87 g of 46% sulfuric acid (Wako Pure Chemical Industries, Ltd., Japan) and 73 g of pure water. The container was further charged with 16.13 g of 31% aqueous citric acid (Fuso Chemical Co., Ltd., Japan). The individual ingredients were well mixed by stirring to prepare an etchant. The resulting etchant was found to have a sulfuric acid content of 5% by mass and a citric acid content of 5% by mass. The etchant was also found to have a pH of 0.3.

The resulting etchant was used to conduct the above evaluations. The results obtained are shown in Table 1.

Examples 2 and 3

The same procedure as shown in Example 1 was repeated to prepare an etchant and to conduct the above evaluations using the resulting etchant, except that the composition of the etchant was varied as indicated in Table 1. The results obtained are shown in Table 1.

Examples 4 to 13

The same procedure as shown in Example 1 was repeated to prepare an etchant and to conduct the above evaluations using the resulting etchant, except that the type and content of carboxylic acid were varied as indicated in Table 1. The results obtained are shown in Table 1.

Example 14

The same procedure as shown in Example 1 was repeated to prepare an etchant and to conduct the above evaluations using the resulting etchant, except that LAVELIN FP (Daiichi Kogyo Seiyaku Co., Ltd., Japan) was further added as a polysulfonic acid compound at the content indicated in Table 1. The results obtained are shown in Table 1.

Examples 15 and 16

The same procedure as shown in Example 1 was repeated to prepare an etchant and to conduct the above evaluations using the resulting etchant, except that methanesulfonic acid (Wako Pure Chemical Industries, Ltd., Japan) or amidosulfuric acid (Wako Pure Chemical Industries, Ltd., Japan) was further added as a pH adjuster at the content indicated in Table 1. The results obtained are shown in Table 1.

Example 17

The same procedure as shown in Example 1 was repeated to prepare an etchant and to conduct the above evaluations using the resulting etchant, except that the substrate for use in the evaluations was prepared by forming an IGO film containing indium oxide ($In_2O_3$) and gallium oxide ($Ga_2O_3$) at an elemental ratio of 95:5 on a glass substrate at a film thickness of 50 nm (500 Å) by sputtering techniques. The results obtained are shown in Table 1.

Example 18

The same procedure as shown in Example 1 was repeated to prepare an etchant and to conduct the above evaluations using the resulting etchant, except that the substrate for use in the evaluations was prepared by forming an indium gallium zinc silicon oxide (IGZSO) film containing indium, gallium, zinc and silicon at an elemental ratio of 38:38:19:5 on a glass substrate at a film thickness of 50 nm (500 Å) by sputtering techniques. The results obtained are shown in Table 1.

Comparative Examples 1 to 18

The same procedure as shown in Example 1 was repeated to prepare an etchant and to conduct the above evaluations using the resulting etchant, except that the composition of the etchant was varied as indicated in Table 2. The results obtained are shown in Table 2.

The results of Examples 1 to 18 shown above indicated that the etchant of the present invention allowed etching of oxides containing at least indium and gallium at a preferred etching rate, caused no precipitate, and further ensured a small change in the etching rate upon oxide dissolution. Moreover, the etchant of the present invention is also shown to have excellent performance as an etchant for use in industrial production because of having a good residue removal property and being less corrosive to wiring materials.

In contrast, Comparative Examples 2, 6, 8, 9 and 12 to 15, each being free from sulfuric acid or a salt thereof, showed a low ability for IGZO dissolution (were not able to dissolve the oxide up to 0.5% (5000 ppm)), and hence changes in their etching rate could not be evaluated. Further, Comparative Examples 2, 8, 13 and 15 also showed a slow initial etching rate. Moreover, Comparative Examples 1, 3, 4, 5, 10 and 11 each showed a large change in the etching rate after dissolution of the IGZO powder. Moreover, Comparative Examples 4 and 7 containing nitric acid or hydrochloric acid instead of sulfuric acid or a salt thereof showed a relatively small change in the etching rate, but tended to be more corrosive to wiring materials. Moreover, Comparative Example 1 free from a carboxylic acid or a salt thereof and Comparative Example 16 containing oxalic acid showed many residues after etching. Moreover, Comparative Examples 16 to 18, each containing oxalic acid, showed the formation of white precipitates after the oxide was dissolved to reach 0.03% (300 ppm) or 0.15% (1500 ppm).

INDUSTRIAL APPLICABILITY

According to preferred embodiments of the present invention, the etchant of the present invention allows etching of oxides containing at least indium and gallium, such as an oxide consisting of indium, gallium and oxygen or an oxide consisting of indium, gallium, zinc and oxygen, at a preferred etching rate, causes no precipitate, has a good residue removal property, is less corrosive to wiring materials, and ensures a small change in the etching rate upon oxide dissolution. Thus, the etchant of the present invention can be expected to have a longer life as an etchant than that of conventionally used etchants and hence can be used in a reduced amount, which means great advantages in terms of both cost and environment.

TABLE 1

| Example | Target | Sulfuric acid | Carboxylic acid except for oxalic acid | Additional ingredient | pH Oxide dissolved [ppm] 0 | 5000 | 10000 |
|---|---|---|---|---|---|---|---|
| 1 | IGZO film | 5% | Citric acid 5% | — | 0.3 | 0.3 | 0.4 |
| 2 | IGZO film | 10% | Citric acid 5% | — | −0.1 | 0 | — |
| 3 | IGZO film | 20% | Citric acid 5% | — | −0.3 | 0 | — |
| 4 | IGZO film | 5% | Acetic acid 3% | — | 0.4 | 0.4 | — |
| 5 | IGZO film | 5% | Glycolic acid 5% | — | 0.3 | 0.3 | — |
| 6 | IGZO film | 5% | Lactic acid 4.5% | — | 0.3 | 0.4 | — |
| 7 | IGZO film | 5% | Malonic acid 5.2% | — | 0.3 | 0.4 | — |
| 8 | IGZO film | 5% | Maleic acid 5.8% | — | 0.3 | 0.4 | — |
| 9 | IGZO film | 5% | Succinic acid 5% | — | 0.3 | 0.4 | — |
| 10 | IGZO film | 5% | Malic acid 6.7% | — | 0.3 | 0.4 | — |
| 11 | IGZO film | 5% | Tartaric acid 7.5% | — | 0.3 | 0.4 | — |
| 12 | IGZO film | 5% | Citric acid 5%, Maleic acid 5% | — | 0.3 | 0.4 | — |
| 13 | IGZO film | 5% | Citric acid 5%, Malic acid 5% | — | 0.3 | 0.4 | — |
| 14 | IGZO film | 5% | Citric acid 5% | LAVELIN FP 0.1% | 0.3 | 0.3 | — |
| 15 | IGZO film | 5% | Citric acid 5% | Methanesulfonic acid 5% | 0.1 | 0.1 | — |
| 16 | IGZO film | 5% | Citric acid 5% | Amidosulfuric acid 5% | 0.2 | 0.2 | — |
| 17 | IGO film | 5% | Citric acid 5% | — | 0.3 | 0.3 | — |
| 18 | IGZSO film | 5% | Citric acid 5% | — | 0.3 | 0.3 | — |

| Example | Etching rate [nm/min] Oxide dissolved [ppm] 0 | 5000 | 10000 | Initial etching rate | Change in etching rate | Precipitate | Residue removal | Corrosiveness to wiring materials Cu | Mo | Al | Ti |
|---|---|---|---|---|---|---|---|---|---|---|---|
| 1 | 81 | 78 | 76 | A | A | A | B | B | A | A | A |
| 2 | 113 | 105 | — | B | B | A | B | A | A | — | — |
| 3 | 148 | 138 | — | B | B | A | B | A | A | — | — |
| 4 | 97 | 96 | — | A | A | A | B | A | A | — | — |
| 5 | 62 | 56 | — | A | B | A | B | A | A | — | — |
| 6 | 74 | 69 | — | A | A | A | B | A | A | — | — |
| 7 | 76 | 72 | — | A | A | A | B | A | A | — | — |
| 8 | 91 | 82 | — | A | B | A | B | A | A | — | — |
| 9 | 95 | 90 | — | A | A | A | B | A | A | — | — |
| 10 | 62 | 60 | — | A | A | A | B | A | A | — | — |
| 11 | 59 | 52 | — | A | B | A | B | A | A | — | — |
| 12 | 73 | 67 | — | A | B | A | B | B | A | — | — |
| 13 | 62 | 56 | — | A | B | A | B | B | A | — | — |
| 14 | 82 | 75 | — | A | B | A | A | A | A | A | A |
| 15 | 104 | 98 | — | B | B | A | B | A | A | — | — |
| 16 | 92 | 84 | — | A | B | A | B | A | A | — | — |
| 17 | 63 | 63 | — | A | A | A | B | B | A | A | A |
| 18 | 46 | 43 | — | B | A | A | B | B | A | A | A |

—: not added or not conducted
IGZO film: a thin film of an oxide consisting of indium, gallium, zinc and oxygen
IGO film: a thin film of an oxide consisting of indium, gallium and oxygen
IGZSO film: a thin film of an oxide consisting of indium, gallium, zinc, silicon and oxygen

TABLE 2

| Comparative Example | Target | Sulfuric acid | Carboxylic acid except for oxalic acid | Additional ingredient | pH Oxide dissolved [ppm] 0 | 5000 | 10000 |
|---|---|---|---|---|---|---|---|
| 1 | IGZO film | 5% | Not added | — | 0.3 | 0.4 | — |
| 2 | IGZO film | Not added | Citric acid 5% | — | 1.8 | Not dissolved | — |
| 3 | IGZO film | Not added | Not added | Hydrochloric acid 1.5% | 0.5 | 0.6 | — |
| 4 | IGZO film | 5% | Not added | Hydrochloric acid 2% | 0.1 | 0.1 | — |
| 5 | IGZO film | Not added | Citric acid 5% | Hydrochloric acid 2% | 0.3 | 0.4 | — |
| 6 | IGZO film | Not added | Not added | Nitric acid 5% | 0.2 | Not dissolved | — |
| 7 | IGZO film | 5% | Not added | Nitric acid 5% | 0 | 0 | — |
| 8 | IGZO film | Not added | Citric acid 5% | Nitric acid 5% | 0.2 | Not dissolved | — |

TABLE 2-continued

| Comparative Example | | | | | Etching rate [nm/min] Oxide dissolved [ppm] | | | Initial etching rate | Change in etching rate | Precipitate | Residue removal | Corrosiveness to wiring materials | | | |
|---|---|---|---|---|---|---|---|---|---|---|---|---|---|---|---|
| 9 | IGZO film | Not added | Not added | Phosphoric acid 5% | 1 | Not dissolved | — | | | | | | | | |
| 10 | IGZO film | 5% | Not added | Phosphoric acid 5% | 0.3 | 0.3 | — | | | | | | | | |
| 11 | IGZO film | Not added | Citric acid 5% | Phosphoric acid 5% | 1 | 1.1 | — | | | | | | | | |
| 12 | IGZO film | Not added | Not added | Methanesulfonic acid 5% | 0.5 | Not dissolved | — | | | | | | | | |
| 13 | IGZO film | Not added | Citric acid 5% | Methanesulfonic acid 5% | 0.4 | Not dissolved | — | | | | | | | | |
| 14 | IGZO film | Not added | Not added | Amidosulfuric acid 5% | 0.7 | Not dissolved | — | | | | | | | | |
| 15 | IGZO film | Not added | Citric acid 5% | Amidosulfuric acid 5% | 0.7 | Not dissolved | — | | | | | | | | |
| 16 | IGZO film | Not added | Not added | Oxalic acid 3.4% | 0.9 | Precipitated (300 ppm) | — | | | | | | | | |
| 17 | IGZO film | 5% | Not added | Oxalic acid 3.4% | 0.3 | Precipitated (1500 ppm) | — | | | | | | | | |
| 18 | IGZO film | 5% | Citric acid 5% | Oxalic acid 3.4% | 0.3 | Precipitated (1500 ppm) | — | | | | | | | | |
| Comparative Example | 0 | 5000 | 10000 | | | | | rate | rate | Precipitate | removal | Cu | Mo | Al | Ti |
| 1 | 108 | 94 | — | | | | | B | C | A | C | B | A | C | — |
| 2 | 2 | Not evaluable | — | | | | | D | Not evaluable | A | — | — | — | — | — |
| 3 | 311 | 264 | — | | | | | C | C | A | — | — | — | — | — |
| 4 | 132 | 119 | — | | | | | B | C | A | — | B | A | D | — |
| 5 | 57 | 39 | — | | | | | A | C | A | — | B | A | B | — |
| 6 | 154 | Not evaluable | — | | | | | B | Not evaluable | A | — | — | — | — | — |
| 7 | 126 | 116 | — | | | | | B | B | A | — | D | D | D | — |
| 8 | 7 | Not evaluable | — | | | | | D | Not evaluable | A | — | — | — | — | — |
| 9 | 61 | Not evaluable | — | | | | | A | Not evaluable | A | — | — | — | — | — |
| 10 | 120 | 102 | — | | | | | B | C | A | — | — | — | — | — |
| 11 | 62 | 41 | — | | | | | A | C | A | — | — | — | — | — |
| 12 | 48 | Not evaluable | — | | | | | B | Not evaluable | A | — | — | — | — | — |
| 13 | 4 | Not evaluable | — | | | | | D | Not evaluable | A | — | — | — | — | — |
| 14 | 57 | Not evaluable | — | | | | | A | Not evaluable | A | — | — | — | — | — |
| 15 | 5 | Not evaluable | — | | | | | D | Not evaluable | A | — | — | — | — | — |
| 16 | 92 | Not evaluable | — | | | | | A | Not evaluable | B | C | A | A | A | — |
| 17 | 101 | Not evaluable | — | | | | | B | Not evaluable | B | — | — | — | — | — |
| 18 | 96 | Not evaluable | — | | | | | A | Not evaluable | B | — | — | — | — | — |

—: not added or not conducted
IGZO film: a thin film of an oxide consisting of indium, gallium, zinc and oxygen

The invention claimed is:

1. An etchant for etching an oxide containing at least indium and gallium, which comprises:
   sulfuric acid or a salt of sulfuric acid;
   a carboxylic acid or a salt of the carboxylic acid; and a polysulfonic acid compound,
   wherein the carboxylic acid is not oxalic acid, and the polysulfonic acid compound is one or more members selected from the group consisting of a naphthalenesulfonic acid formalin condensate and a salt of the naphthalenesulfonic acid formalin condensate, a polyoxyethylene alkyl ether sulfate salt, and a polyoxyethylene alkylphenyl ether sulfate salt.

2. The etchant according to claim 1, wherein the carboxylic acid or the salt of the carboxylic acid is one or more members selected from the group consisting of acetic acid, glycolic acid, lactic acid, malonic acid, maleic acid, succinic acid, malic acid, tartaric acid and citric acid.

3. The etchant according to claim 1, wherein sulfuric acid or the salt of sulfuric acid is included at a concentration of 0.5% to 20% by mass, and the carboxylic acid or the salt of the carboxylic acid is included at a concentration of 0.1% to 15% by mass.

4. The etchant according to claim 1, further comprising:
   a pH adjuster.

5. The etchant according to claim 4, wherein the pH adjuster is one or more members selected from the group consisting of methanesulfonic acid and amidosulfuric acid.

6. The etchant according to claim 1, which has a pH value equal to or less than 1.

7. The etchant according to claim 1, wherein the oxide is in the form of a thin film having a film thickness of 1 to 1000 nm.

8. The etchant according to claim 1, wherein sulfuric acid is included at a concentration of 3% to 9% by mass, and a carboxylic acid is included at a concentration of 3% to 10% by mass.

9. A process for etching an oxide containing at least indium and gallium, which comprises:
   applying an etchant comprising sulfuric acid or a salt of sulfuric acid, a carboxylic acid or a salt of the carboxylic acid, and a polysulfonic acid compound in etching the oxide containing at least indium and gallium,
   wherein the carboxylic acid is not oxalic acid, and the polysulfonic acid compound is one or more members selected from the group consisting of a naphthalenesulfonic acid formalin condensate and a salt of the naphthalenesulfonic acid formalin condensate, a polyoxyethylene alkyl ether sulfate salt, and a polyoxyethylene alkylphenyl ether sulfate salt.

10. The process according to claim 9, wherein the carboxylic acid or the salt of the carboxylic acid is one or more members selected from the group consisting of acetic acid, glycolic acid, lactic acid, malonic acid, maleic acid, succinic acid, malic acid, tartaric acid and citric acid.

11. The process according to claim 9, wherein the etchant comprises sulfuric acid or the salt of sulfuric acid at a concentration of 0.5% to 20% by mass, and the carboxylic acid or the salt of the carboxylic acid at a concentration of 0.1% to 15% by mass.

12. The process according to claim 9, wherein the etchant further comprises a pH adjuster.

13. The process according to claim 12, wherein the pH adjuster is one or more members selected from the group consisting of methanesulfonic acid and amidosulfuric acid.

14. The process according to claim 9, wherein the etchant has a pH value equal to or less than 1.

15. The process according to claim 9, wherein the oxide is in the form of a thin film having a film thickness of 1 to 1000 nm.

16. The process according to claim 9, wherein the etchant comprises sulfuric acid at a concentration of 3% to 9% by mass and a carboxylic acid at a concentration of 3% to 10% by mass.

* * * * *